(12) United States Patent
Shinozaki et al.

(10) Patent No.: US 6,288,772 B1
(45) Date of Patent: *Sep. 11, 2001

(54) SCANNING EXPOSURE METHOD AND SCANNING TYPE EXPOSURE APPARATUS

(75) Inventors: Tadaaki Shinozaki, Kawasaki; Masamitsu Yanagihara, Zama, both of (JP)

(73) Assignee: Nikon Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/500,489

(22) Filed: Feb. 9, 2000

(30) Foreign Application Priority Data

Feb. 12, 1999 (JP) .................................. 11-034993

(51) Int. Cl.[7] ............................. G03B 27/42; G03B 27/32
(52) U.S. Cl. ............................................. 355/53; 355/77
(58) Field of Search .................. 355/53, 67, 77, 355/52, 54, 55; 430/5, 20, 22, 311; 356/399–401

(56) References Cited

U.S. PATENT DOCUMENTS

| | | | |
|---|---|---|---|
| 4,694,178 | * 9/1987 | Harte | 250/396 R |
| 4,806,987 | * 2/1989 | Mori et al. | 355/53 |
| 4,924,257 | 5/1990 | Jain | 355/53 |
| 5,227,839 | 7/1993 | Allen | 355/53 |
| 5,437,946 | 8/1995 | McCoy | 430/5 |
| 5,602,620 | * 2/1997 | Miyazaki et al. | 355/53 |
| 5,617,181 | 4/1997 | Yanagihara et al. | 355/46 |
| 5,617,211 | * 4/1997 | Nara et al. | 356/401 |
| 5,625,436 | * 4/1997 | Yanagihara et al. | 355/53 |
| 5,686,997 | 11/1997 | Shirasu | 356/401 |
| 5,729,331 | * 3/1998 | Tanaka et al. | 355/53 |
| 5,736,300 | * 4/1998 | Mizuno et al. | 430/313 |
| 5,859,690 | 1/1999 | Toguchi | 355/53 |
| 5,897,986 | 4/1999 | Dunn et al. | 430/394 |
| 5,917,579 | * 6/1999 | Miyajima | 355/53 |
| 5,966,201 | * 10/1999 | Shiraishi et al. | 355/53 |
| 5,985,496 | 11/1999 | Nara et al. | 430/30 |
| 5,995,199 | * 11/1999 | Shimozaki et al. | 355/53 |
| 5,999,244 | * 12/1999 | Yanagihara et al. | 355/53 |

FOREIGN PATENT DOCUMENTS

| | | |
|---|---|---|
| 7-57986 | 3/1995 | (JP) . |
| 7-135165 | 5/1995 | (JP) . |
| 8-330220 | 12/1996 | (JP) . |
| 10-62809 | 3/1998 | (JP) . |
| 10-64782 | 3/1998 | (JP) . |
| 7-64782 | 3/1998 | (JP) . |
| PCT/US98/19856 | 4/1999 | (WO) . |

OTHER PUBLICATIONS

Partial Translation of JP-10-64782.
Partial Translation of JP-7-135165.
English Language Abstract of Japanese Patent No. 08-330220.
English Language Translation of Japanese Patent No. 10-62809.
Australian Patent Office Search Report, Sep. 19, 2000.
Australian Patent Office Written Opinion, Sep. 19, 2000.

* cited by examiner

Primary Examiner—Russell Adams
Assistant Examiner—Hung Henry Nguyen
(74) Attorney, Agent, or Firm—Oliff & Berridge, PLC

(57) ABSTRACT

In the scanning exposure method of the present invention, a mask and a substrate are moved in a synchronous manner, and first patterns and a second pattern are connectedly exposed on the substrate. At least a portion of the first patterns and at least a portion of the second pattern form a common pattern, and the common pattern and non-common patterns, which differ from the common pattern, are formed in mask as the first patterns and the second pattern. The first patterns and the second pattern are connected by means of the common pattern.

22 Claims, 10 Drawing Sheets

DIRECTION OF DRIVE

SCANNING EXPOSURE METHOD AND SCANNING TYPE EXPOSURE APPARATUS

BACKGROUND OF THE INVENTION

1. Field of the Invention

The present invention relates to a scanning exposure method and scanning type exposure apparatus which move a mask and a substrate in a synchronous manner in a predetermined direction, and conduct the scanning exposure of a pattern formed in the mask onto a substrate such as a glass substrate or the like.

2. Description of the Related Art

In recent years, liquid crystal display panels, which make it possible to make personal computers and televisions and the like thinner, have come to be employed in a variety of ways as the display elements of such devices. This type of liquid crystal display panel is manufactured by patterning transparent thin film electrodes on a planar rectangular photosensitive substrate into a desired pattern using photolithography. An exposure apparatus which exposes a pattern formed on a mask (reticle) onto a photoresist layer on a photosensitive substrate via a projection optical system is used as an apparatus for this photolithography.

Liquid crystal display panels have increased in surface area in order to improve the viewability of the screen. A scanning type exposure apparatus has been proposed as an exposure apparatus capable of meeting these needs; such an apparatus, as disclosed, for example, in Japanese Patent Application, first publication No. HEI 7-57986, combines a plurality of projection optical systems which project the mask pattern onto a substrate as a positive image, moves the mask and the glass substrate in a predetermined direction in a synchronous manner, and conducts scanning with respect to the projection optical systems, and thereby successively transfers patterns having a large exposure region in a direction perpendicular to the direction of synchronous movement, that is to say, the patterns of LCD (liquid crystal displays) formed on the mask or the like, to the exposure region on the glass substrate.

At this time, so that the apparatus size does not increase even as the projection region increases, and so that satisfactory image formation characteristics are obtained, the projection optical system employed is one in which a plurality of projection optical systems are disposed in such a way that the ends of adjoining projection regions overlap in a direction perpendicular to the direction of scanning, so that the adjoining projection regions are displaced by a predetermined amount in the direction of scanning. In such a case, the field diaphragm of each projection optical system is platform-shaped so that the total opening width of the field diaphragm in the direction of scanning is always the same. For this reason, in a scanning type exposure apparatus such as that described above, the junction parts of adjoining projection optical systems overlap and are exposed, and this is advantageous in that the optical aberrations or exposure intensity of the projection optical systems can be smoothly altered.

In recent years, the use of large glass substrates of approximately one square meter as substrates for producing liquid crystal display panels has been contemplated in order to increase throughput by producing multiple liquid crystal panels, or in order to produce liquid crystal display panels having larger display regions in order to create televisions.

In this way, in order to expose a liquid crystal display panels having a substrate size corresponding to a large display area, a method has been considered in which a mask having a size equal to the substrate is employed and scanning and exposure are conducted all at once, and a method has been considered in which the pattern is formed while dividing the pattern of a single liquid crystal display panel into a plurality of regions. By using the former method, high-speed throughput becomes possible; however, the cost of the mask becomes excessive, and the method is not practical.

On the other hand, when the latter method is employed, misalignments occur as a result of mask pattern drawing errors at the pattern junction parts, optical aberrations in the projection optical system or positioning errors of the stage which moves the glass substrate, and there are cases in which the device characteristics are negatively affected. Furthermore, when a number of such patterns are overlaid on one another, errors in the overlaying of the exposed regions and differences in linear width in the patterns change in a discontinuous manner at the junction parts of the patterns, and when the liquid crystal display panel is engaged, color irregularities and the like are produced at the junction parts, and the quality of the device declines.

A standing type exposure apparatus for exposing a large glass substrate which attempts to solve these problems is disclosed in, for example, Japanese Patent Application, first publication No. HEI 10-64782. In this apparatus, a mask stage which supports the mask and a substrate stage which supports the glass substrate are driven in a synchronous manner and scanning and exposure is conducted, and thereafter, step movement of the mask stage and the substrate stage is conducted in a direction perpendicular to the direction of synchronous movement by a distance corresponding to the width of the illuminated region, and this process is repeated once or a plurality of times, and thereby a plurality of separate patterns are connected and transferred onto a large glass substrate.

However, the conventional scanning exposure methods and scanning type exposure apparatuses described above have the following problems.

The LCD patterns described above comprise picture element parts which are formed with a pattern in which a plurality of electrodes corresponding to a plurality of pixels are systematically arranged, and conducting parts which serve to electrically connect the pattern of the various electrodes of the picture element parts and the driver circuits which drive these electrodes, are present. These picture element parts are formed in the various connected partial patterns on the glass substrate by the scanning type exposure apparatus described above.

However, in the scanning type exposure apparatus described above, the contents of the mask pattern are not considered, and the mask pattern is simply divided and transferred to the glass substrate, so that the mask may have a size which is equal to that of the glass substrate or may be larger than the glass substrate. For this reason, in addition to the increasing cost of the mask, it is necessary that the stage which supports the mask have the same size as the mask, and this contributes to an increase in size in the apparatus and to an increase in costs.

SUMMARY OF THE INVENTION

The present invention was created in light of the above circumstances; it has as an object thereof to provide a scanning exposure method and scanning type exposure apparatus which are capable of exposing large substrates without increasing the size of the apparatus or increasing costs.

In order to achieve this object, the scanning exposure method of the present invention is a scanning exposure method in which a mask and substrate are moved in a synchronous manner and exposure of the substrate is conducted so as connect first patterns and a second pattern, wherein at least a portion of the first pattern and at least a portion of the second pattern are a common pattern, and a common pattern and a non-common pattern which differs from the common pattern are formed as the first patterns and the second pattern, and by means of the common pattern, the first pattern and the second pattern are connected.

Accordingly, in the scanning exposure method of the present invention, the first patterns and the second pattern are connected on a substrate by the common pattern, so that it is possible to continuously form the first patterns and the second pattern. Furthermore, at this time, using the common pattern formed in the mask, it is possible to expose the first patterns and the second pattern, so that it is no longer necessary to separately form the common pattern for the second pattern and the first patterns in the mask, so that it is possible to reduce the size of the mask. As a result of this, it is also possible to reduce the size of the mask stage which supports the mask. Furthermore, it is no longer necessary to employ a plurality of masks, so that it is possible to achieve high throughput.

By means of this, in this scanning exposure method, by adjusting the illuminated regions in each scanning exposure, it is possible to expose a substrate having a large surface area in a connected manner using a single mask, so that it is possible to reduce the size of the mask, and thus to control the manufacturing costs of the mask, and it is also possible to reduce the size of the mask stage, thus making possible a reduction in size and a decrease in costs of the scanning type exposure apparatus itself. In particular, when the same pattern is repeatedly transferred, as in the case of liquid crystal display devices or a semiconductor memory, the effect becomes more pronounced if this repeated pattern is employed as the common pattern.

The first patterns and the second pattern may be connected by overlapping a portion of the common pattern. In such a case, even when the common pattern is divided, it is possible to smoothly conduct the connection and it is possible to prevent the development of misalignment in the correction pitch of the common pattern and the attendant decline in the device characteristics, as well as to prevent a decrease in the device quality as a result of discontinuous changes in the connection pitch.

The scanning exposure may be conducted by means of a plurality of optical systems arranged in parallel in a direction perpendicular to the direction of synchronous movement. In such a case, although the surface area of the projection region is large, by employing a plurality of small optical systems, it is possible to form the device in a highly accurate manner and at low cost. Accordingly, it is possible to realize a reduction in size and in cost even in the case of the so-called multilens type scanning exposure apparatuses.

The intensity of the exposure light of each of the optical systems may be measured and this intensity may be corrected for each synchronous movement. In this case, it is possible to prevent fluctuations in the amount of exposure for each exposure, even in the case in which a plurality of synchronous movements are conducted, so that it is possible to prevent fluctuations in the linear width of the pattern resulting from the first patterns and the second pattern, and it is easily possible to maintain the quality of the device after exposure.

The intensity may be adjusted in such a manner that the intensity of the optical path in overlapping projection regions is approximately the same. In such a case, the illumination at the junction parts of the projection regions, and in the junction parts in the first patterns and the second pattern can be made the same as that in other regions, and it is thus possible to obtain a uniform amount of exposure over the entirety of the pattern on the substrate, and it is thus possible to make the linear width of the pattern uniform over the entirety of the pattern surface. For this reason, the quality of the device after exposure is substantially improved.

The optical paths of predetermined optical systems may be blocked. In such a case, the illumination regions may easily be adjusted for each synchronous movement.

The connection of the first pattern and second pattern may be conducted using exposure light via inner side optical systems. In this case, in comparison with the case in which optical systems are employed which are externally positioned, there is little effect from positioning errors of the optical systems, and it is possible to execute highly accurate scanning exposure. Additionally, there is a reduced step movement distance of the substrate stage, so that high-speed throughput becomes possible.

Prior to exposing the second pattern, it is possible to move the mask in a direction perpendicular to the direction of synchronous movement, based on the arranged spacing of the partial pattern. In such a case, it is possible to easily and reliably make the pattern continuous on the substrate in the junction parts even where the pitch of the projection region is not an integer multiple of the arrangement spacing of the partial pattern, and it is thus possible to realize high-speed throughput.

Furthermore, the scanning type exposure apparatus of the present invention is a scanning type exposure apparatus which is provided with a mask stage for supporting the mask and with a substrate stage for supporting a substrate, which moves the mask stage and the substrate stage in a synchronous manner with respect to the optical path and conducts exposure such that first patterns and a second pattern are connected on the substrate, wherein, in the mask, a common pattern common to at least a portion of the first patterns and at least a portion of the second pattern, and a non-common pattern which differs from this common pattern, are formed, and which is provided with a control apparatus which controls the movement of the mask stage and the substrate stage so that the first patterns and the second pattern are connected by the common pattern.

Accordingly, by means of this scanning type exposure apparatus of the present invention, the control apparatus controls the mask stage and the substrate stage and the first patterns and the second pattern are connected on the substrate by the common pattern, so that it is possible to continuously produce the first pattern and the second pattern. Furthermore, at this time, using the common pattern formed in mask, it is possible to expose the first pattern and the second pattern, so that it is not necessary to separately form the common pattern for the second pattern and the first pattern on mask, and it is possible to reduce the size of the mask. As a result, it is possible to reduce the size of the mask stage. Furthermore, it is not necessary to employ a plurality of masks, so that it is possible to obtain high throughput.

By means of this, using this scanning type exposure apparatus, it is possible to conduct exposure in a connected manner on a substrate having a large surface area using a single mask, by adjusting the illuminated regions for each scanning exposure, so that it is possible to reduce the size of the mask, and it is possible to control the manufacturing costs of the mask, and it is also possible to reduce the size of the mask stage. Accordingly, it is possible to realize a reduction in size and in cost of the scanning type exposure apparatus itself. In particular, when a pattern is repeatedly transferred, such as in the case of liquid crystal display devices or semiconductor memory, the effects described above become particularly pronounced when the repeated pattern is employed as the common pattern.

DETAILED DESCRIPTION OF THE PREFERRED EMBODIMENTS

Hereinbelow, embodiments of the scanning exposure method and scanning type exposure apparatus of the present invention will be explained with reference to FIGS. 1 through 14.

Here, the explanation will be conducted using the example of a case in which five projection optical systems are employed, and a pattern is formed on the substrate by means of three scanning exposures.

Figure 1:
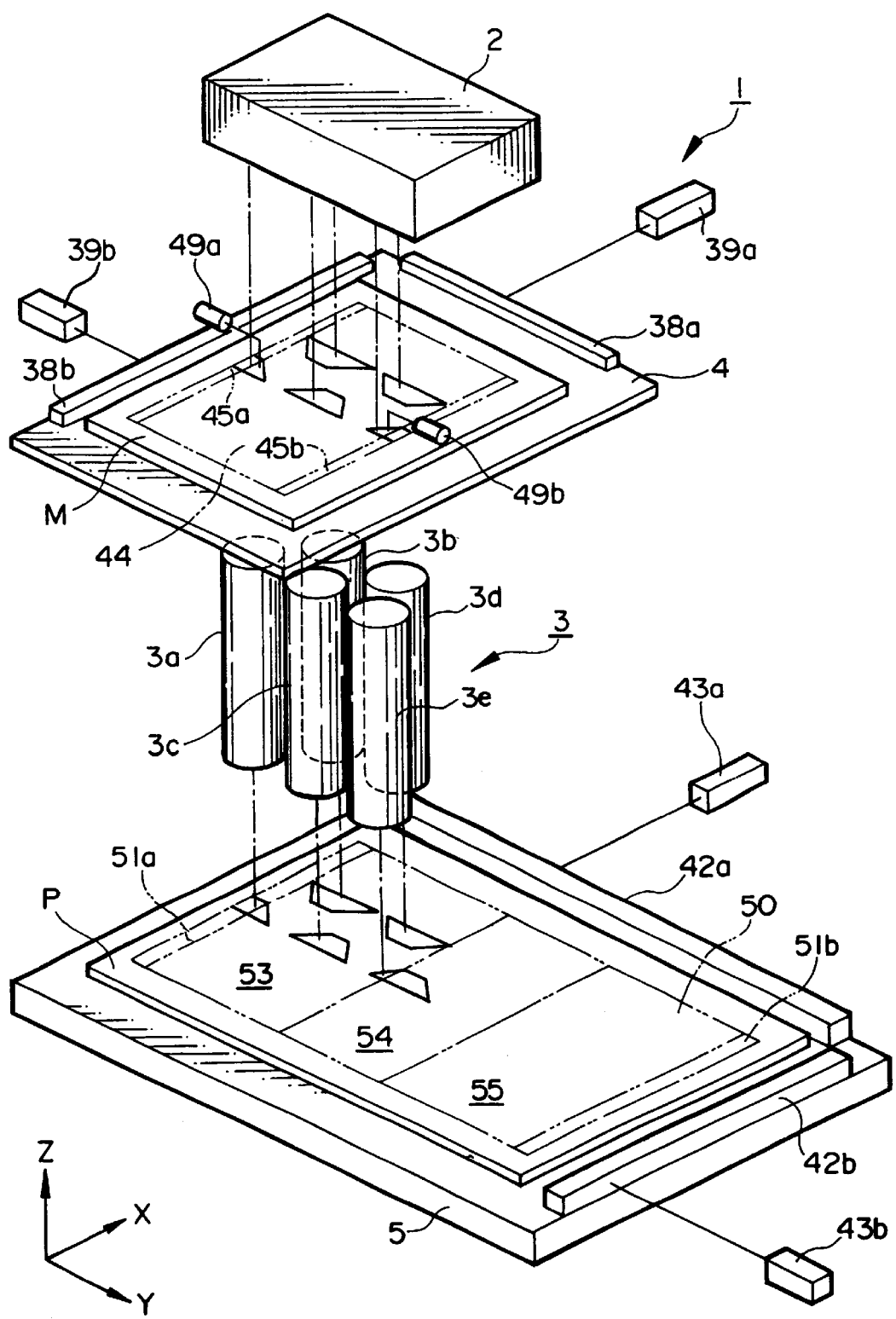
FIG. 1 shows an embodiment of the present invention; it is a perspective view showing the outlines of the structure of a scanning type exposure apparatus.

FIG. 1 is a perspective view showing the outlines of the structure of a scanning type exposure apparatus of the present embodiment. Scanning type exposure apparatus 1 is provided with an illumination optical system 2, a projection optical system 3 comprising a plurality of projection system modules (optical systems) 3a~3e, a mask stage 4 for supporting mask (reticle) M, and a substrate stage S for supporting a glass substrate (substrate) P, as the main parts thereof. In FIG. 1, the optical axis direction of the projection optical system 3 is made the Z direction, while the direction of synchronous movement of mask M and glass substrate P (scanning direction) which is perpendicular to the Z direction is made the X direction, and the direction perpendicular to the Z direction and the X direction (the non-scanning direction) is made the Y direction.

Figure 2:
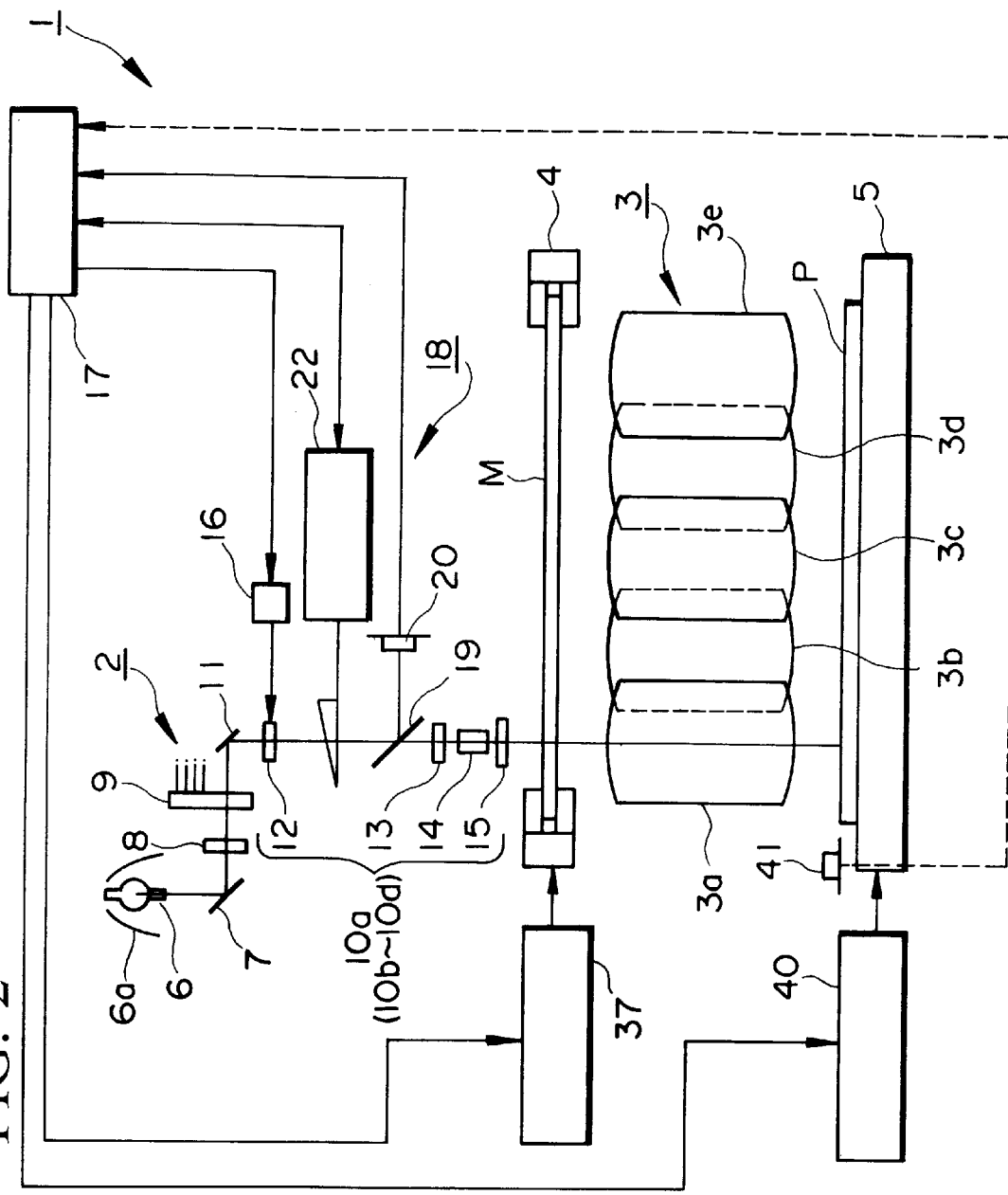
FIG. 2 is a schematic diagram of this scanning type exposure apparatus.

As shown in FIG. 2, the illumination optical system 2 shines a light beam (exposure light) emitted from a light source such as an ultrahigh pressure mercury lamp or the like onto mask M; it comprises a dichroic mirror 7, a wavelength selecting filter 8, a light guide 9, and illumination system modules 10a~10e, which are disposed so as to correspond to the projection system module illumination systems 3a~3e (in FIG. 2, only that corresponding to illumination optical system 10a is shown for the purposes of convenience).

Then the light beam emitted from light source 6 is caused to converge by elliptical mirror 6a, and is directed to dichroic mirror 7. Dichroic mirror 7 reflects the light beam having the wavelength required for exposure, while light beams of other wavelengths pass through. The light beam reflected by dichroic mirror 7 is directed to wavelength selecting filter 8, and becomes a light beam having a wavelength which is appropriate for conducting exposure by projection optical system 3 (normally, at least one band among the g, h, and i lines), and is directed to light guide 9. Light guide 9 splits the incident light beam into five beams, and these are directed to each illumination system module 10a~10e via reflecting mirror 11.

Illumination system modules 10a~10e generally comprise illumination shutter 12, a relay lens 13, a fly eye lens 14, and a condenser lens 15. In the present embodiment, illumination system modules 10b~10e, which have the same structure as the illumination system module 10a, are disposed at standard spacings in the X direction and the Y direction. The light beams from the illumination system modules 10a~10e illuminate different illumination regions on mask M.

The illumination shutter 12 is disposed behind light guide 9 in such a manner as to be fully advanceable and retractable with respect to the optical path of the light beam. When illumination shutter 12 blocks the optical path, the light beam from the optical path is cut off, while when the illumination shutter opens the optical path, the cutoff of the light beam is removed. Furthermore, a shutter drive part 16 which advances and retracts the illumination shutter 12 with respect to the optical path is provided at the illumination shutter 12. The shutter drive part 16 is controlled by control apparatus 17.

Light amount adjustment mechanisms 18 are attached to each illumination system module 10a~10e. The light amount adjusting mechanisms 18 adjust the amount of exposure of each optical path by setting the intensity of the light beam for each optical path; they comprise a half mirror 19, a detector 20, a filter 21, and a filter drive part 22. The half mirror 19 is disposed in the optical path between the filter 21 and the relay lens 13, and directs a portion of the light beam passing through filter 21 to the detector 20. The detector 20 detects the intensity of the incident light beam, and outputs an intensity signal to the control apparatus 17.

Figure 3:
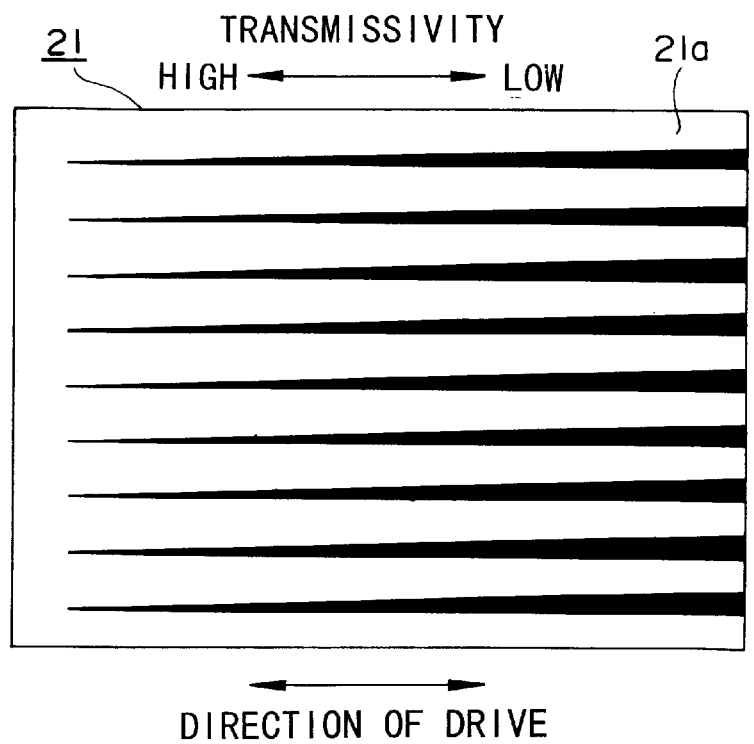
FIG. 3 is a top view of a filter employed in this scanning type exposure apparatus.

As shown in FIG. 3, filter 21 is patterned in the form of a screen using Cr or the like on a glass plate 21a, and is formed so that the transmittivity thereof gradually changes in a linear manner within a certain range along the Y direction, and this is disposed between the illumination shutter 12 and the half mirror 19 in each optical path. The half mirrors 19, the detectors 20, and the filters 21 are disposed in each of the plurality of optical paths. The filter drive part 22 moves the filter 21 along the Y direction based on the directives from the control apparatus 17.

The control apparatus 17 controls the filter drive part 22 so that the illumination intensity reaches a specified value based on the intensity of the light beam detected by the detector 20, and thereby adjusts the amount of light for each optical path.

The light beams passing through the light amount adjusting mechanism 18 reach the fly eye lens 14 via the relay lens 13. A secondary light source is formed at the exit surface side of the fly eye lens 14, and it is thus possible to illuminate the illumination regions of mask M at a uniform intensity via condenser lens 15.

Figure 4:
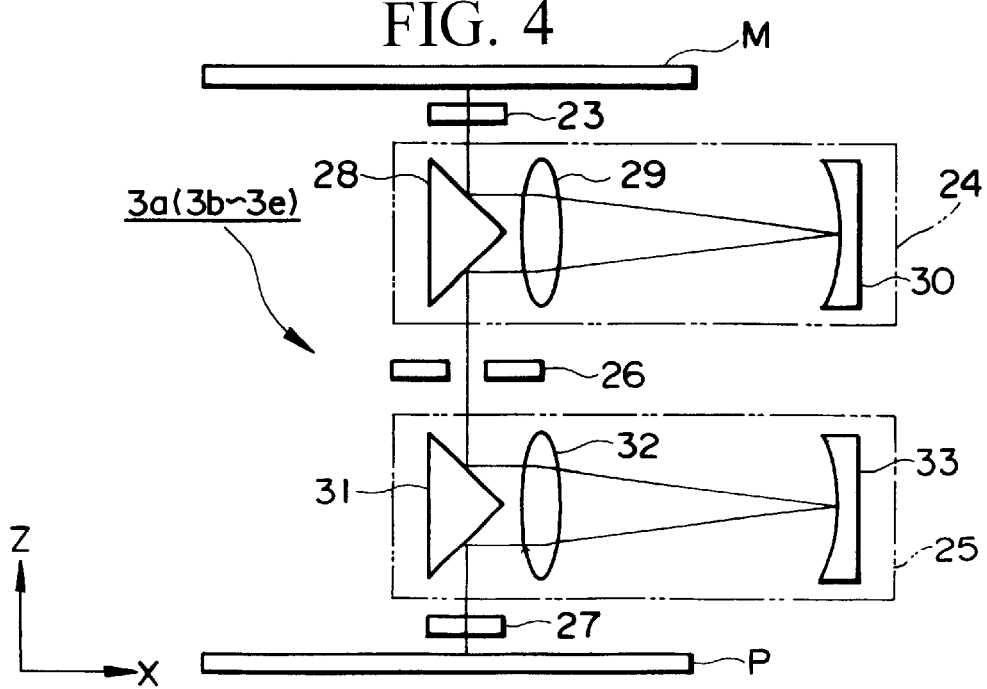
FIG. 4 is a schematic diagram of a projection system module employed in this scanning type exposure apparatus.

The light beams which pass through mask M are directed to projection system modules 3a–3e. Then, the pattern of mask M of the illumination regions is transferred onto the glass substrate P to which a resist was applied, with predetermined image formation characteristics. As shown in FIG. 4, each projection system module 3a–3e comprises an image shift mechanism 23, a group of two catadioptric systems 24 and 25, a field diaphragm 26, and a magnification adjustment mechanism 27.

The light beams passing through mask M are directed to the image shift mechanism 23. The image shift mechanism 23 shifts the pattern image of mask M in the X or Y directions by rotating a pair of parallel planar glass substrates about the Y axis or the X axis. The light beams passing through the image shift mechanism 23 are directed to the first catadioptric system 24.

The catadioptric system 24 forms an intermediate image of the pattern of mask M, and comprises a right prism 28, a lens 29, and a concave mirror 30. The right prism 28 is made freely rotatable about the Z axis, and serves to rotate the pattern image of mask M.

A field diaphragm 26 is disposed at this intermediate image position. The field diaphragm 26 sets the image field on the glass substrate P. The light beams which pass through the field diaphragm 26 are directed to the second catadioptric system 25. The catadioptric system 25 comprises, in the same way as the catadioptric system 24, a right prism 31, a lens 32, and a concave mirror 33. Furthermore, the right prism 31 is also made freely rotatable about the Z axis, and serves to rotate the pattern image of mask M.

The light beams emitted from the catadioptric system 25 pass through the magnification adjusting mechanism 27, and form an image of the pattern of mask M on glass substrate P at a positive equimultiple. The magnification adjusting apparatus 27 comprises, for example, three lenses: a planoconvex, a biconvex, and planoconcave lens, and by moving the biconvex lens positioned between the planoconvex lens and the planoconcave lens in the direction of the Z axis, this apparatus changes the magnification of the pattern image of the mask M.

Figure 5:
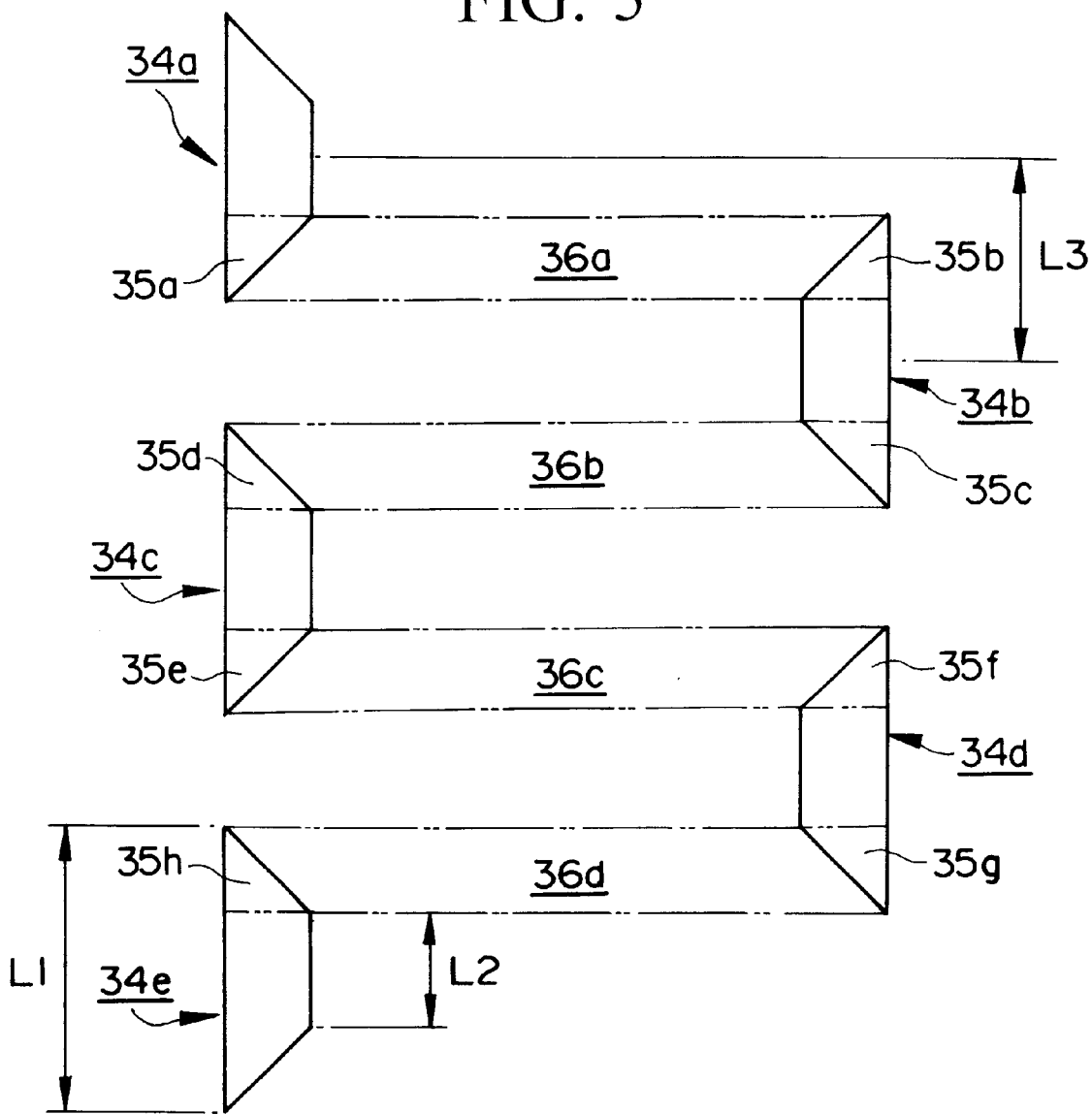
FIG. 5 is a top view of an image field established by the projection system module.

FIG. 5 is a planar view of the image fields (projection regions) 34a–34e of the projection system modules 3a–3e on the glass substrate P. As shown in FIG. 5, the image fields 34a–34e have a trapezoidal shape. The image fields 34a, 34c, and 34e and the image fields 34b and 34d are so disposed as to be opposed to one another in the X axial direction. Furthermore, as shown by the two-dotted lines, the image fields 34a–34e are disposed in parallel so that the end parts of adjoining image fields (35a and 35b, 35c and 35d, 35e and 35f, 35g and 35h) overlap one another in the Y direction, and the total width of the image fields in the X direction is set so as to be approximately equal. That is to say, the amount of exposure when conducting scanning exposure in the X direction is equal.

In this way, the image fields 34a–34e resulting from the projection system modules 3a–3e are provided with junction parts 36a–36d which overlap, and thereby, it is possible to make the changes in the optical aberrations and the changes in intensity in the junction parts 36a–36d smooth. In the present embodiment the shape of the image fields 34a–34e was trapezoidal; however, these may be hexagonal, diamond shaped, or parallelogram.

The mask stage 4 supports the mask M, and has a long stroke in the X direction which conducts the primary scanning exposure and a very small stroke on the order of a few millimeters in the Y direction, which is perpendicular to the scanning direction. As shown in FIG. 2, a mask stage drive part 37, which drives the mask stage 4 in the direction described above, is provided for the mask stage 4. This mask stage drive part 37 is controlled by the control apparatus 17.

As shown in FIG. 1, motion mirrors 38a and 38b are disposed at the edges of the mask stage 4 in perpendicular directions. A laser interferometer 39a is disposed facing the motion mirror 38a. A laser interferometer 39b is disposed facing the motion mirror 38b.

The laser interferometers 39a and 39b emit light to the movement mirrors 38a and 38b and measure the distance between themselves and the movement mirrors 38a and 38b, and thereby, make it possible to detect the position of the mask stage 4 in the X direction and the Y direction, that is to say, the position of the mask M, with high resolution and highly accurately. Additionally, the results of the detection of the laser interferometers 39a and 39b are outputted to the control apparatus 17.

The control apparatus 17 monitors the position of the mask stage 4 from the output of the laser interferometers 39a and 39b, and by controlling the mask stage drive part 37, makes it possible to move the mask stage 4 to a desired position.

The substrate stage 5 supports the glass substrate P, and in the same way as the mask stage 4, has a long stroke in the X direction which conducts the primary scanning exposure and has a long stroke for step movement in the Y direction which is perpendicular to the direction of scanning. Furthermore, a substrate stage drive part 40 which drives the substrate stage 5 in the direction described above is provided at substrate stage 5. This substrate stage drive part 40 is controlled by the control apparatus 17.

Furthermore, the substrate stage 5 is made so as to be freely moveable in the Z direction. Additionally, the substrate stage 5 is provided with a measurement mechanism (not depicted in the figure) for measuring the position in the Z direction of the pattern surface of the mask M and the exposure surface of the glass substrate P, and controls the position such that the pattern surface mask M and the exposure surface of the glass substrate P maintain a constant predetermined space therebetween. Furthermore, a detector (illumination intensity sensor) 41 is provided on the substrate stage 5 at a height which is approximately equal to that of the exposure surface of the glass substrate P. The detector 41 detects the illumination intensity of the light beam on the glass substrate P, and outputs the detected intensity signal to the control apparatus 17.

Furthermore, at the edges of the substrate stage 5, the movement mirrors 42a and 42b are disposed in perpendicular directions. A laser interferometer 43a is disposed facing the movement mirror 42a. Furthermore, a laser interferometer 43b is disposed facing the movement mirror 42b.

These laser interferometers 43a and 43b emit laser light to the movement mirrors 42a and 42b and measure the distance between themselves and the movement mirrors 42a and 42b, and thereby, make it possible to detect the position of the substrate stage 5 in the X direction and the Y direction, that is to say, the position of the glass substrate P, with a high degree of resolution and highly accurately. Then, the detection results of the laser interferometers 43a and 43b are output to the control apparatus 17.

The control apparatus 17 monitors the position of the substrate stage 5 from the output of the laser interferometers 43a and 43b and by controlling the substrate stage drive part 40, makes it possible to move the substrate stage 5 to a desired position. In other words, the control apparatus 17 controls both drive parts 37 and 40 while monitoring the position of the mask stage 4 and the substrate stage 5, and thereby moves the mask M and the glass substrate P in a synchronous manner with respect to the projection system modules 3a~3e in the X direction at a desired scanning rate (synchronous movement rate).

Figure 6:
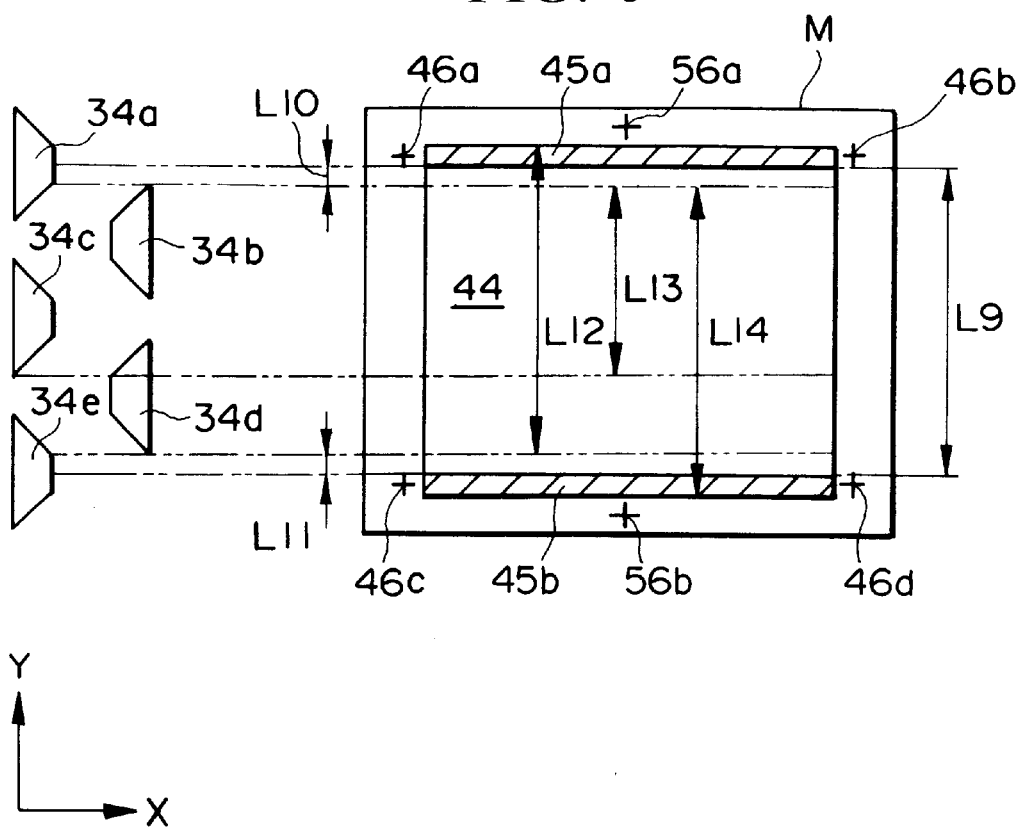
FIG. 6 is a top view showing the relationship between the mask and the image field.

As shown in FIG. 6, a picture element pattern (common pattern) 44 and peripheral circuit pattern (non-common pattern) 45a and 45b, which are positioned at the ends of the picture element pattern 44 in the Y direction, are formed in the pattern region of the mask M. In the picture element pattern 44, a plurality of electrodes, corresponding to a plurality of pixels, are arranged systematically in a pattern. Driver circuits and the like for driving the electrodes of the picture element pattern 44 are formed in the peripheral circuit patterns 45a and 45b.

Figure 7:
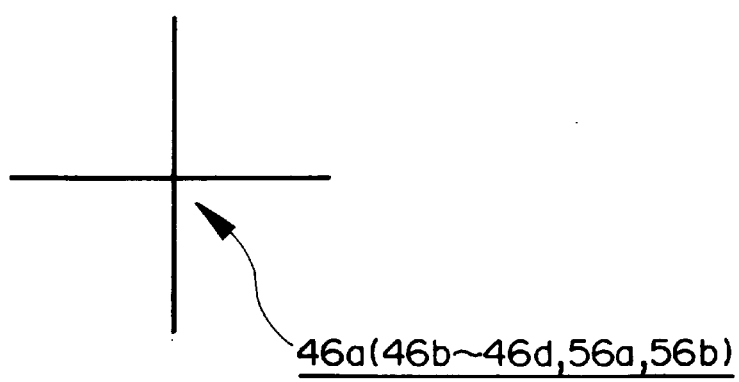
FIG. 7 is a top view of a mask mark and a mask alignment mark formed in this mask.

Furthermore, mask marks 46a~46d, which are positioned at the corners of the mask M, are formed at the periphery of the pattern region of mask M. The mask marks 46a~46d are used in order to calculate a variety of correctional amounts when aligning the mask M, and are formed in the shape of a cross, as shown in FIG. 7, using Cr or the like.

Furthermore, in the mask M, mask alignment marks 56a and 56b, which are positioned in the vicinity of the center of both side edges along the X direction (that is to say, in the center of both ends of the mask M in the Y direction) are formed. The mask alignment marks 56a and 56b are employed when positioning the mask with the glass substrate P, and in the same way as the mask marks 46a~46d, are formed in the shape of a cross using Cr or the like.

Figure 8:
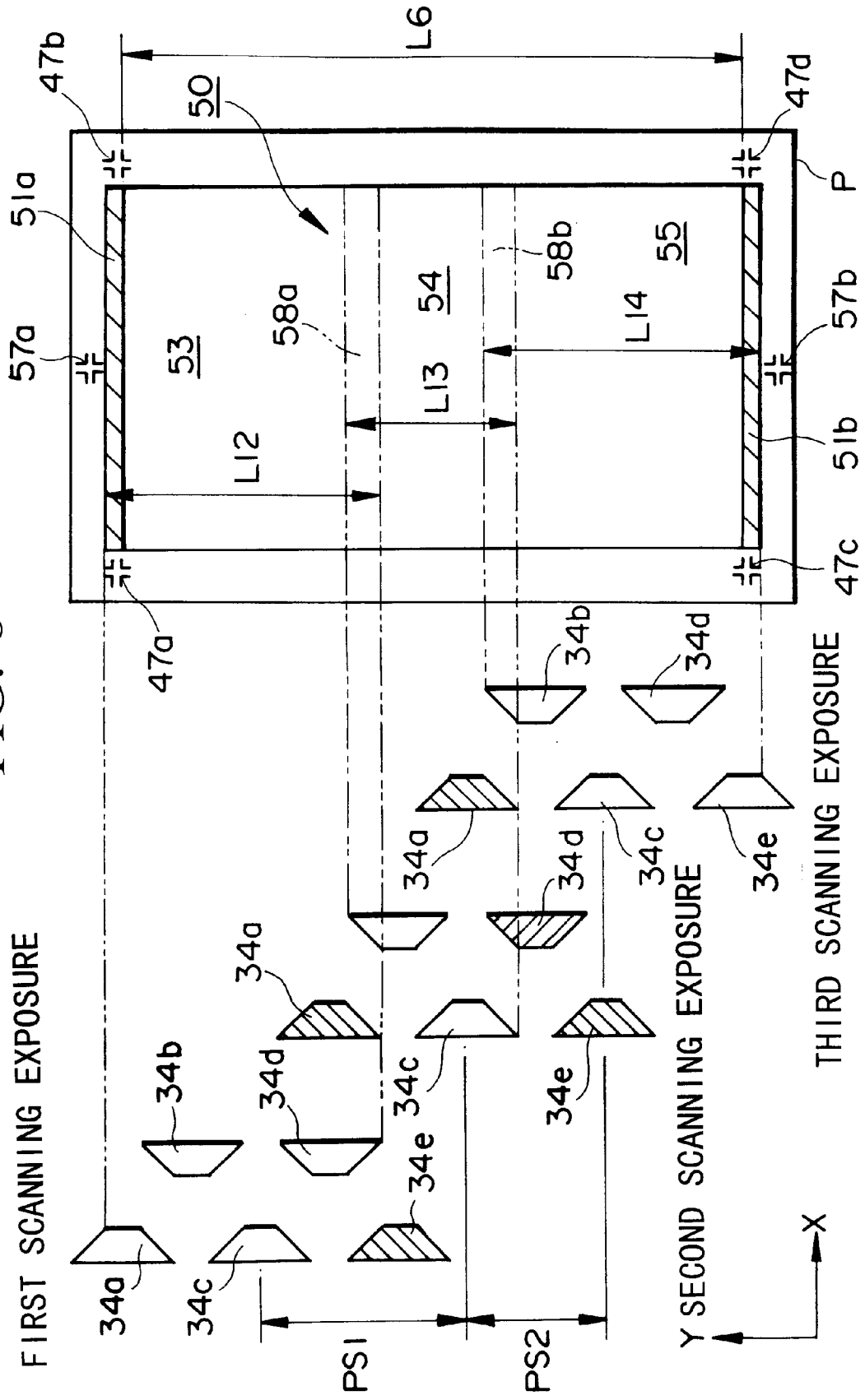
FIG. 8 is a top view showing the relationship between the glass substrate and the image field.
Figure 9:
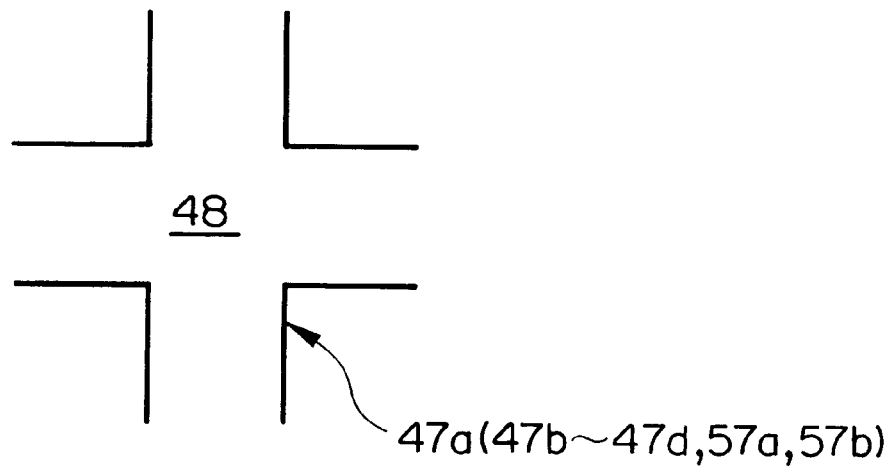
FIG. 9 is a top view showing a substrate mark and a substrate alignment mark formed on the glass substrate.

As shown in FIG. 8, in the same way as in the case of the mask M, the substrate marks 47a~47d, which are positioned at the corners of the glass substrate P, are formed in the periphery of the projection region of glass substrate P. The substrate marks 47a~47d are used in calculating various correctional amounts when aligning the glass substrate P, and are formed with a transparent part 48 having the shape of a cross such as that shown in FIG. 9, using Cr or the like.

In the glass substrate P, as well, substrate alignment marks 57a and 57b, which are positioned in the vicinity of the center of both edges in the X direction (that is to say, in the center of the edges in the Y direction of the glass substrate P), are formed. The substrate alignment marks 57a and 57b are used during the positioning of the substrate with the mask M, and in the same way as the substrate marks 47a~47d above, are formed with cross-shaped transparent parts using Cr or the like.

These mask marks 46a~46d, the substrate marks 47a~47d, the mask alignment marks 56a and 56b, and the substrate alignment marks 57a and 57b are detected by the alignment systems 49a and 49b which are disposed above the mask M in FIG. 1. The alignment systems 49a and 49b have drive mechanisms (not depicted in the figure) which move in the X direction, and withdraw from within the illumination region during scanning exposure.

First, the method of setting the dimensions of the pattern of mark M in the scanning type exposure apparatus 1 having the structure described above will be explained below.

Figure 11:
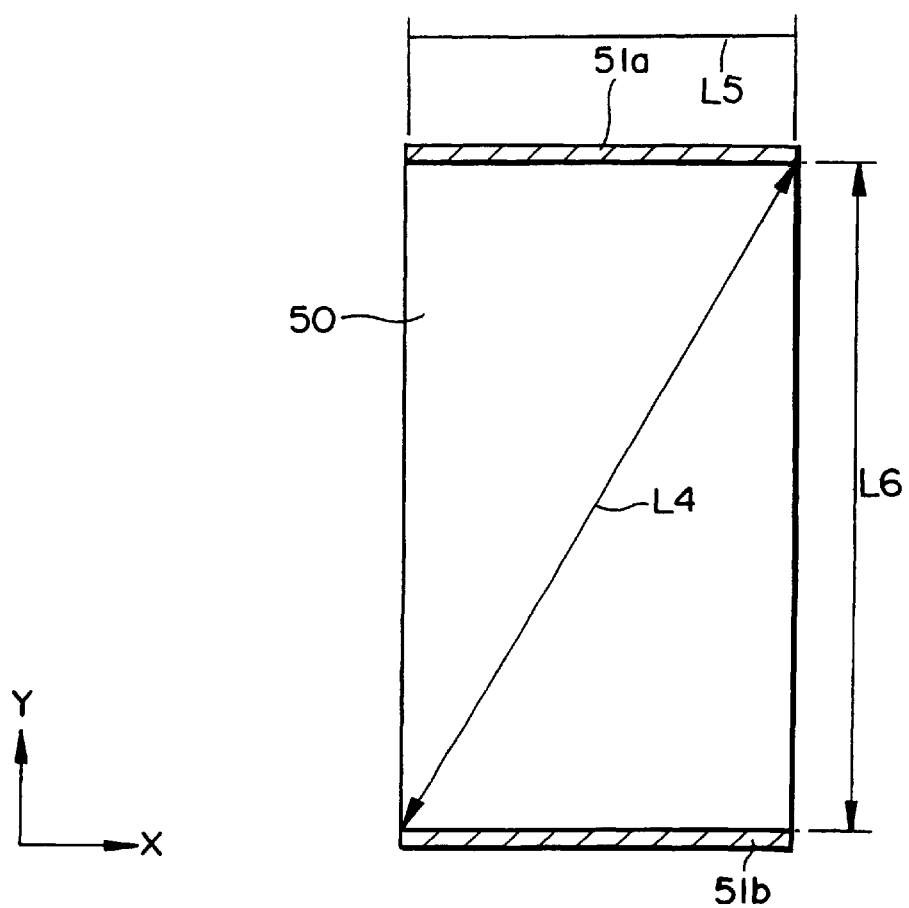
FIG. 11 is a top view showing a pattern exposed onto a glass substrate.

Here, the image fields 34a~34e shown in FIG. 5 are in the shape of a trapezoid with the long side L1 thereof set to 88 mm, and the short side L2 thereof set to 72 mm, and the spacing L3 between adjoining image fields (the pitch of the image fields in the Y direction) is set to 8 mm. Furthermore, as shown in FIG. 11, a picture element pattern 50 and peripheral circuit patterns 51a and 51b, which are positioned at the ends of the picture element pattern 50 in the Y direction, are formed in glass substrate P.

The size of picture element pattern 50 is set so that the diagonal length L4 thereof is 32 inches, the length in the X direction L5 is 398.52 mm, and the length L6 in the Y direction is 708.48 mm. Furthermore, the picture element pattern 50 is a repeating pattern in which a unit pattern (partial pattern) 52 such as that shown in FIG. 12 continues 1080 times at a pitch P1 of (0.123×3) mm in the X direction and (1920×3) times at a pitch P2 of 0.123 mm in the Y direction, so that these correspond to the RGB colors.

Furthermore, the peripheral circuit patterns 45a and 45b of the mask M shown in FIG. 6 have the same dimensions and same shape as the peripheral circuit patterns 51a and 51b of the glass substrate P, and are positioned on the mask M so that they are exposed by the end outside the projection system modules 3a and 3e. The picture element pattern 44 of the mask M has a length in the X direction which is the same as that of the picture element pattern 50 of the glass substrate P, but the length in the Y direction thereof differs.

Here, in the picture element pattern of the mask M, the length in the Y direction is represented by L9, and when the lengths in the Y direction which are exposed only by the end outside the projection system modules 3a and 3e are represented by L10 and L11, respectively, then the length L9 is determined as given below.

Figure 12:
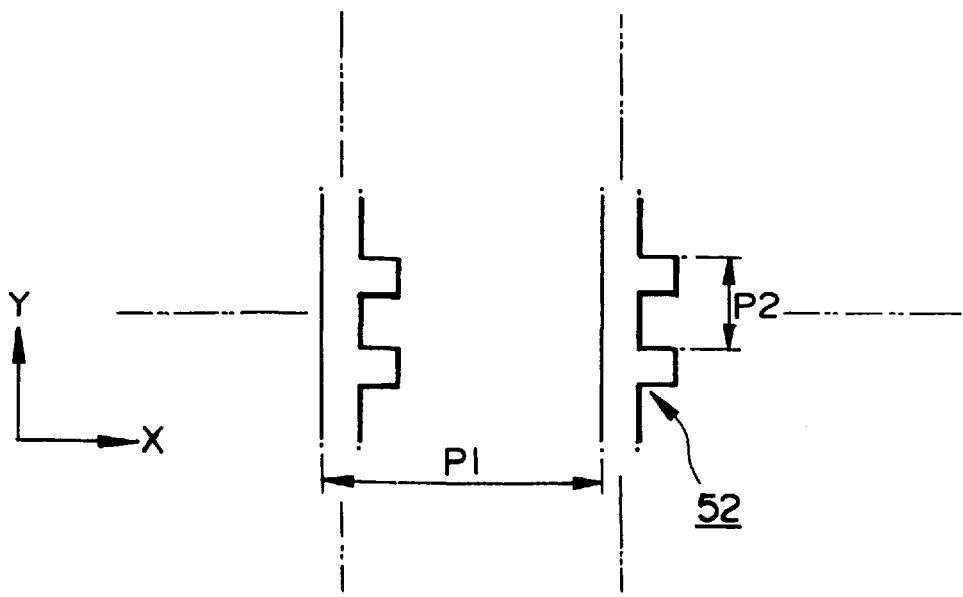
FIG. 12 is a top view showing a unit pattern which comprises a picture element pattern within this pattern.

First, length L9 is an integer multiple of the repeating pitch P2 of 0.123 mm, because of the repeating of the unit pattern 52 shown in FIG. 12. Accordingly, the following formula is obtained.

$$L9 = L10 + L11 + L3 \times 2 + L1 = 0.123 \times n1 \tag{1}$$

Furthermore, the following relationship results.

$$L10 + L11 + L3 \times 7 + 88 \; (1920 \times 3) \times 0.123 \tag{2}$$

Possible integers n1 which satisfy both formula 1 and formula 2 above include 2507 and 2808; here, N1 is set equal to 2508, and L9 is set equal to 308.484 mm.

Next, prior to exposing the pattern of the mask M onto the glass substrate P using a scanning type exposure apparatus having the structure described above, the procedure by which the mask M and the glass substrate P are positioned will be explained.

The mask M and the glass substrate P are positioned on and supported by, respectively, the mask stage 4 and the substrate stage 5, and when this occurs, illumination light comprising wavelengths to which the resist is not sensitive is emitted from the alignment system 49a in the −Z direction via a reflection mirror which is not depicted in the figures.

The emitted illumination light is irradiated onto the mask alignment mark 56a of the mask M, and, passing through the mask M, is irradiated onto the substrate alignment mark 57a on the glass substrate P via a projection system module 3a which is positioned to the outside. The light reflected by the substrate alignment mark 57a is directed to the alignment system 48a via the projection system module 3a, the mask M, and the reflection mirror. On the other hand, the light reflected by the mask alignment mark 56a is also directed to the alignment system 49a via the reflection mirror.

Figure 10:
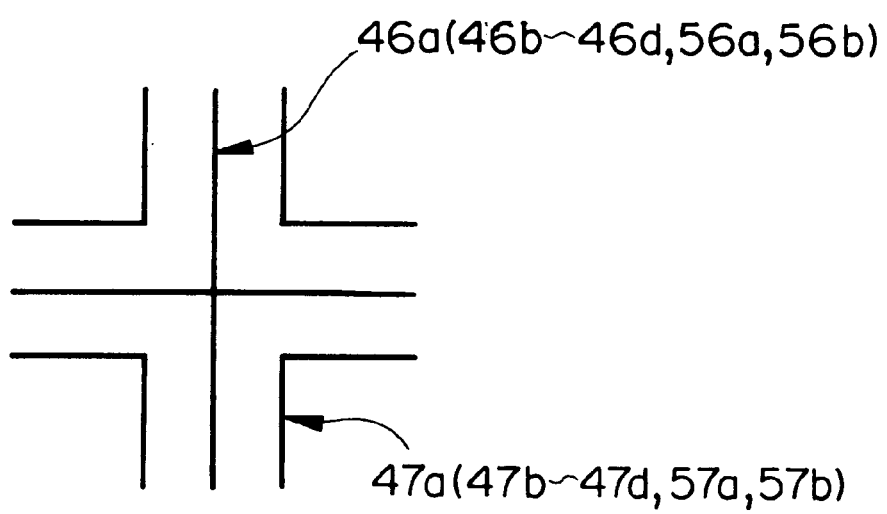
FIG. 10 is a top view of an image acquired by overlapping the mask mark and the substrate mark with the mask alignment mark and the substrate alignment mark.

The alignment system 49a detects the position of the alignment marks 56a and 57a based on the light reflected from the mask M and the glass substrate P. Concretely, the alignment system 59a simultaneously forms an image of the light reflected from the mask M and the glass substrate P on a two-dimensional CCD image screen via an image formation optical system not depicted in the figures, within the alignment system 49a, and, as shown in FIG. 10, processes the obtained image in which the mask alignment mark 56a overlaps the transparent part 48 of the substrate alignment mark 57a. By means of this, the amount of positional displacement between the mask alignment mark 56a and the substrate alignment mark 57a, that is to say, the amount of positional displacement between the mask M and the glass substrate P, is calculated.

Next, the substrate stage 5 is moved in the −Y direction with respect to the mask stage 4. Then, by means of a process which is similar to that described above, the mask alignment mark 56b and the substrate alignment mark 57b are measured using the alignment system 49b, and the amount of positional displacement between the mask M and the substrate P is determined. Based on these results, either the mask stage 4 or the substrate stage 5 are moved slightly, and the positional alignment of the mask M and the glass substrate P is conducted. The illumination light is irradiated onto the mask alignment mark 56b of the mask M at this time, and also passes through the mask M and is irradiated onto the substrate alignment mark 57b on the glass substrate P via the projection system module 3e positioned to the outside.

Figure 13:
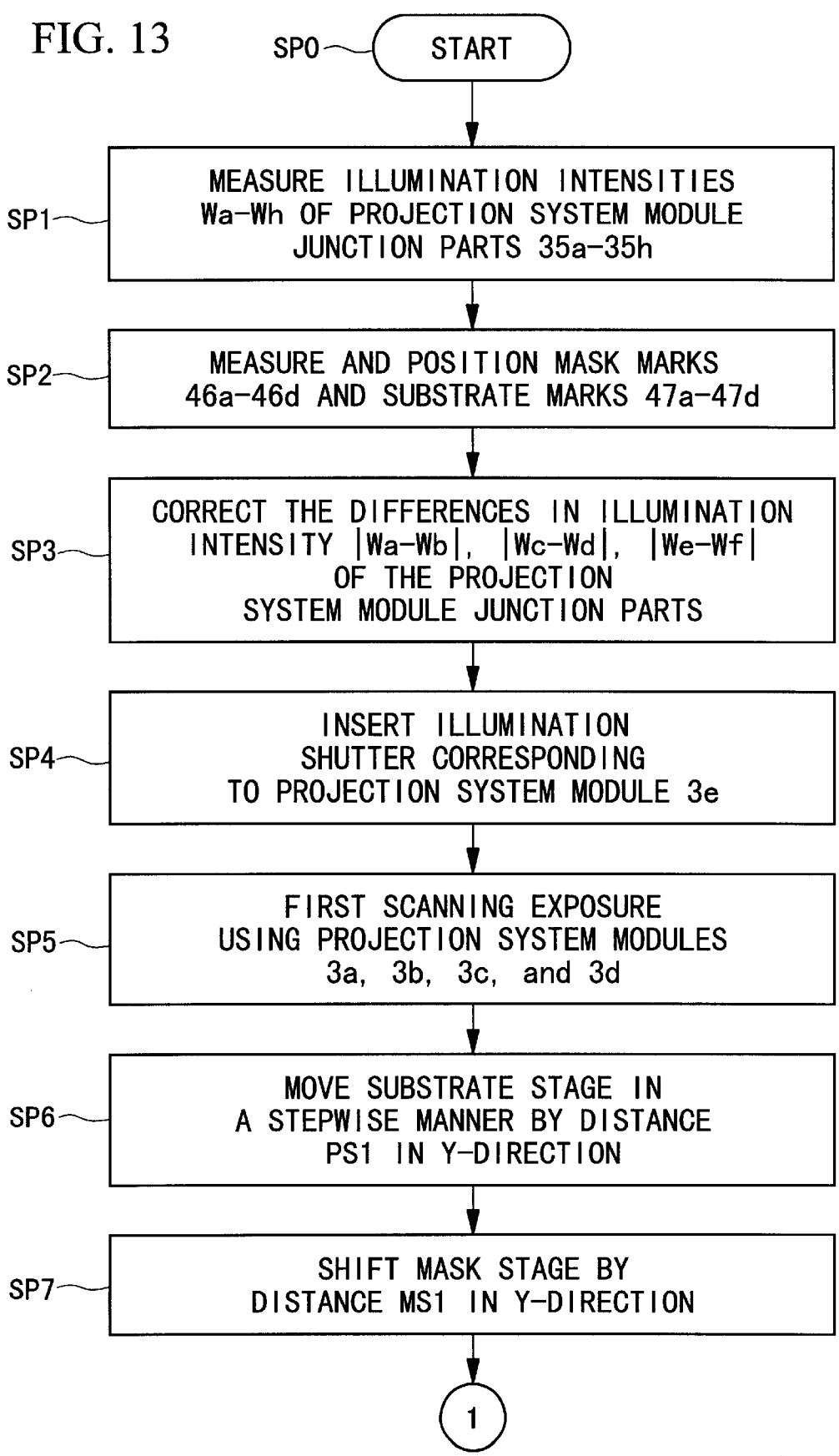
FIGS. 13 and 14 are flowcharts showing the sequence of the exposure operation.
Figure 14:
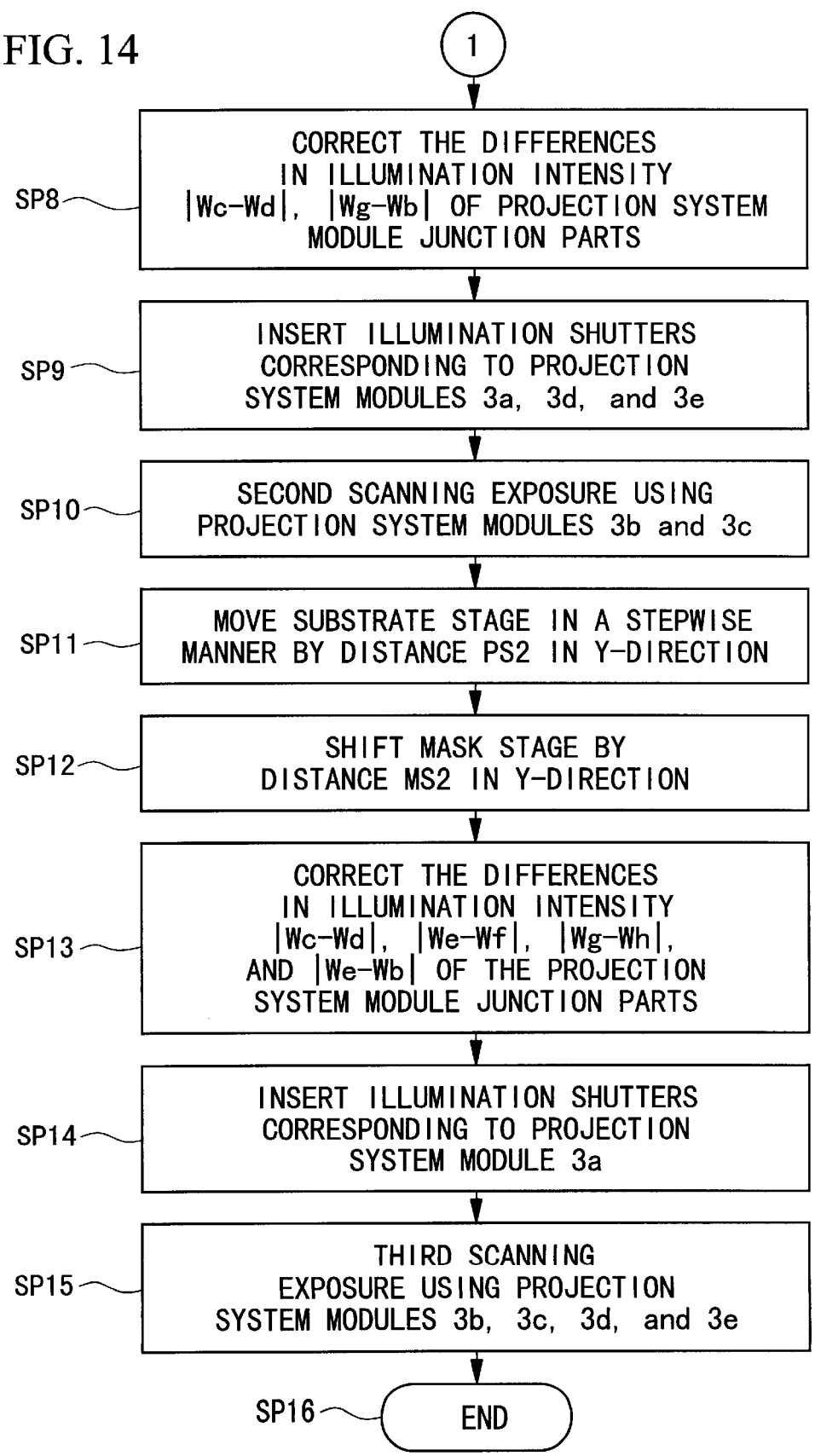

Next, the operation of exposing the pattern of the mask M onto the glass substrate P by means of the scanning type exposure apparatus 1 having the structure described above will be explained in the order of the flowchart shown in FIGS. 13 and 14.

In the following, the movement of the mask stage 4 and of the substrate stage 5 is conducted based on the control of the control apparatus 17 via the mask stage drive part 37 and the substrate stage drive part 40.

Here, as shown in FIG. 8, the entirety of the exposure pattern on the glass substrate P is divided into 3 regions: a divided pattern (first pattern) 53, which has a length in the Y direction of L12 and which contains the peripheral circuit pattern 51a and a part of the picture element pattern 50, a divided pattern (second pattern) 54, which has a length in the Y direction of L13, and which has a part of the picture element pattern 50, and a divided pattern (first pattern) 55, which has a length in the Y direction of L14 and which contains the peripheral circuit pattern 51b and a part of the picture element pattern 50; three scanning exposures are conducted.

Here, length L12 represents the distance in the Y direction between the end point in the +Y direction of the short side of the image field 34a and the end point in the −Y direction of the long side of the image field 34d. Length L13 represents the distance in the Y direction between the end point in the +Y direction of the long side of the image field 34b and the end point in the −Y direction of the long side of the image field 34c. Length L14 represents the distance in the Y direction between the end point in the +Y direction of the long side of the image field 34b and the end point in the −Y direction of the short side of the image field 34e.

Furthermore, the divided pattern 53 and the divided pattern 54 overlap by a junction part 58a, and the divided pattern 54 and the divided pattern 55 overlap by a junction part 58b. Furthermore, the junction parts 58a and 58b overlap by the same distance (in other words, 8 mm) as the junction parts 36a~36b of the image fields 34a~34e.

First, when the exposure operation is initiated (step SP0), the intensities Wa~Wh corresponding to the junction parts 35a~35h of the projection system modules 3a~3b are successively calculated (step SP1). Concretely, the control apparatus 17 first sends a directive to the filter drive part 22, and the filter 21 is moved so that the light beams from the light source 6 pass through the filter 21 at maximum transmittivity. When the filter 21 is moved, the light beams from the light source 6 are irradiated via an elliptical mirror 6a. The irradiated light beams pass through the filter 21, the half mirror 19, the mask M, and the projection system modules 3a~3e, and then reach the glass substrate P. At this time, the mask M may be moved so that it is at a position such that a pattern or the like is not formed on the illuminated regions, or the mask M may be removed.

Then, within the image fields 34a~34e, the intensities Wa~Wh of the light beams at the end parts 35a~35h which overlap at the junction parts 36a~36d are successively measured by the detector 41. At the same time, a portion of the light beams irradiated from the light source 6 are directed to the detector 20 by the half mirror 19. The detector 20 measures the intensity of the light beams and outputs the detected intensity signal to the control apparatus 17. The control apparatus 17 stores the intensity of each optical path measured by the detectors 20 and 41 and the intensities Wa~Wh in the end parts 35a~35h.

Next, in step SP2, while moving the mask stage 4 and the substrate stage 5 in a step manner using the control of the control apparatus 17, the mask marks 46a~46d and the substrate marks 47a~47d are successively superimposed on one another using the alignment systems 49a and 49b and the amounts of positional displacement between the mask marks 46a~46d and the substrate marks 47a~47b are calculated, in the same manner as in the calculation of the mask alignment marks 56a and 56b and the substrate alignment marks 57a and 57b described above. By means of this, the amount of positional displacement between the mask M and the glass substrate P is calculated.

Next, the relative shift of mask M and glass substrate P, the rotation, and the scaling correction amount are calculated from the amount of positional displacement obtained, and during scanning exposure, based on these correctional amounts, the correction of the image shift mechanism 23, the magnification adjustment mechanism 27, and the right prisms 28 and 31, which conduct image rotation, of each projection system module 3a~3e is conducted.

In step SP3, using the intensities Wa~Wh at the end parts 35a~35h which were calculated by the detector 41 in step SP1 as a standard, the filter 21 is driven while conducting calculations with the detector 20 for each illumination system module 10a~10e so that the intensities Wa~Wh maintain approximately constant values, and the differences in intensity (|Wa−Wb|, |Wc−Wd|, |We−Wf|) attain a minimum value. By means of this, the amount of light in the light beam in each optical path is corrected.

In step SP4, the illumination shutter 12 of the illumination system module 10e corresponding to the projection system module 3e is inserted into the optical path via the shutter drive part 16, and as shown in FIG. 8, cuts off the illuminating light of the optical path corresponding to the image field 34e (the illumination shutters 12 of the illumination system module 10a~10d open each optical path). By means of this, an illumination region is established in the mask M having a length L12 in the Y direction which contains the peripheral circuit pattern 45a and a portion of the picture element pattern 44.

In step SP5, the mask M and the glass substrate P are moved synchronously in the X direction, and a first scanning exposure is conducted. By means of this, as shown in FIG. 8, a divided pattern 53 corresponding to the illumination region established by projection system modules 3a~3d is exposed on the glass substrate P.

Next, in step SP6, the substrate stage 5 is moved in a step manner by a distance of PS1 in the +Y direction. This distance PS1 corresponds to three times the pitch L3 in the Y direction of the image fields. In other words, the distance PS1 is determined by the following formula.

$$PS1=L3\times3=80\ mm\times3=240\ mm$$

In step SP7, the mask stage 4 is shifted by a distance of MS1 in the Y direction so that the picture element pattern 50 is continuous in the pattern junction part 58a on the glass substrate P. This distance MS1 can be calculated by the following formula, where n2 is a positive integer.

$$MS1=80\times3-0.123\times n2 \tag{3}$$

Here, considering the case in which the distance MS1 approaches 0, when n2 equals 1951, then MS1 equals 0.027 mm, while when n2 equals 1952, MS1 equals −0.096 mm. Thus n2 is set equal to 1951 so that the shift amount of mask stage 4 is small, and the mask M is moved by a distance of MS1=0.027 mm in the +Y direction via mask stage 4.

In step SP8, the second scanning exposure is conducted by image fields 34b and 34c, and the intensity in the image fields 34b and 34c is corrected. Furthermore, the illumination intensity of the image field 34d, which exposes the junction part 58a of the glass substrate P during the first scanning exposure, and of the image field 34b, which exposes the junction part 58a during the second scanning exposure, are corrected.

Concretely, in the same manner as in step SP3, the filter 21 is driven while measuring the illumination intensity of each optical path using the detector 20 for each illumination system module 10b and 10c, so that the difference in intensity (|Wc−Wd|) between the image end parts 35c and 35d of image fields 34b and 34c, and the difference in intensity (|Wg−Wb|) between the end part 35g of the image field 34d during the first scanning exposure and the end part 35b of the image field 34b during the second scanning exposure, reach a minimum value. By means of this, the amount of light in the light beams of each optical path is corrected.

In step SP9, the illumination shutters 12 of the illumination system modules 10a, 10b, and 10e corresponding to the projection system modules 3a, 3d, and 3e are inserted into the optical paths via shutter drive parts 16, and the illumination light of the optical paths corresponding to the image fields 34a, 34d, and 34e is blocked (the illumination shutters 12 of illumination system modules 10b and 10c open each optical path). By means of this, an illumination region is established in mask M having a length L13 in the Y direction containing a portion of the picture element pattern 44.

In step SP10, the mask M and the glass substrate P are again moved in a synchronous manner in the X direction and a second scanning exposure is conducted. By means of this, as shown in FIG. 8, a divided pattern 54 corresponding to the illumination region established by the image fields 34b and 34c of the projection system modules 3b and 3c on the glass substrate P is exposed in a state in which it overlaps with the divided pattern 53 at the junction part 58a.

Next, in step SP11, the substrate stage 5 is moved in a step manner by a distance PS2 in the +Y direction, in the same way as in step SP6. This distance PS2 corresponds to two times the pitch L3 in the Y direction of the image fields. That is to say, the distance PS2 may be calculated by the following formula.

$$PS2=L3\times2=160\ mm$$

In step SP12, in the same way as in step SP7, the mask stage 4 is shifted by a distance of MS2 in the Y direction with respect to the position of the mask M during the first scanning exposure, or in other words is shifted by a distance (MS2−MS1) with respect to the second scanning exposure, so that the picture element pattern 50 is continuous in the pattern junction part 58b on glass substrate P. This distance MS2 may be calculated by the following formula, where n3 represents a positive integer.

$$MS2=80\times3+80\times2-0.123\times n3 \tag{4}$$

Here, considering the case in which the distance MS2 approaches a value of 0, when n3 is set equal to 3252, then MS2 equals 0.004 mm, while when n3 is set equal to 3253, MS2 is equal to −0.119 mm. Thus, the value of n3 is set to 3252 so that the shift amount of the mask stage 4 is small, and the mask stage 4 is shifted by a distance of MS2=0.004 mm in the +Y direction.

If, on the other hand, the value of n3 is set to 3253, and scanning exposure is conducted after shifting the mask stage 4 by a distance MS2 of −0.119 mm, then the junction part 58b on glass substrate P has a continuous picture element pattern 50; however, the length L6 in the Y direction of the entirety of the picture element pattern 50 becomes 708.603 mm, and one pitch part P2 becomes too long, at 0.123 mm. That is to say, in considering the shift distance MS2 of mask M, the exposure width in the Y direction on glass substrate P is given by the following formula.

$$L5=L6+L3\times7+L1-MS2=(1920\times3)\times0.123 \tag{5}$$

Accordingly, here, in order to reduce the shift distance MS2 of the mask M, or in other words in order to set the value n3 to 3252 and to set the second shift distance MS2 of the mask M to a value of 0.004 mm, the length L6 on the mask M is set so that n1 equals 2508, and the length L9 equals 308.484 mm.

In step SP13, the third scanning exposure is conducted by the image fields 34b~34e, so that the illumination intensity of these image fields 34b~34e is corrected. Furthermore, the illumination intensity of the image field 34c, which exposes the junction part 58b of the glass substrate P during the second scanning exposure, and that of the image field 34b, which exposes the junction part 58b during the third scanning exposure, are corrected.

Concretely, as in step SP3, the filter 21 is driven while measuring the illumination intensity of the light beams of each optical path using the detectors 20 for each illumination system module 10b~10e, so that the differences in intensity (|Wc−Wd|, |We−Wf|, |Wg−Wh|) between the end parts 35c and 35d, the end parts 35e and 35f, and the end parts 35g and 35h of image fields 34b~34e, as well as the difference in intensity (|We−Wb|) between the end part 35e of the image field 34c during the second scanning exposure and the end part 35b of the image field 34b during the third scanning exposure, attain a minimum value. By means of this, the amount of light in the light beam of each optical path is corrected.

In step SP14, the illumination shutter 12 of the illumination system module 10a corresponding to the projection system module 3a is inserted into the optical path via the shutter drive part 16, and as shown in FIG. 8, this blocks the illumination light of the optical path with respect to the image field 34a (the illumination shutters 12 of illumination system modules 10b~10e open each optical path). By means of this, an illumination region is established in mask M having a length L14 in the Y direction which contains a portion of the picture element pattern 44 and the peripheral circuit pattern 45b.

In step SP15, the mask M and the glass substrate P are again moved in a synchronous manner in the X direction, and a third scanning exposure is carried out. By means of this, as shown in FIG. 8, a divided pattern 55 corresponding to the illumination region which was established by the image fields 34b~34e of the projection system modules 3b~3e on the glass substrate P is exposed in a state in which it overlaps with the divided pattern 54 at the junction part 58b.

Thus, using a single mask M, the connected exposure of a glass substrate P which is larger than the mask M is completed (step SP16).

In the scanning exposure method and scanning exposure apparatus of the present embodiment, the pattern formed in the mask M is divided into a picture element pattern 44 which is common to a plurality of the divided patterns 53, 54, and 55, and the peripheral circuitry patterns 45a and 45b which differ from the picture element pattern 44, during the scanning exposure, so that by making the selection of the patterns 44, 45a, and 45b described above differ of the plurality of divided patterns by adjusting the illumination region in each scanning exposure, it is possible to freely establish the various first and second patterns, and it is possible to conduct the connected exposure of a glass substrate P having a large surface area comprising a plurality of the divided regions 53, 54, and 55 using a single mask M. For this reason, the mask M can be reduced in size, and it is ~possible to reduce the manufacturing costs of the mask M. At the same time, it is also possible to reduce the size of the mask stage 4, and to reduce the size and the costs of the scanning type exposure apparatus 1 itself.

Furthermore, using the scanning exposure method and the scanning type exposure apparatus of the present embodiment, when an exposure is conducted while overlapping a portion of the adjoining divided patterns 53, 54, and 55, it is possible to repeatedly employ common portions and non common portions within a single mask M of a target pattern. Accordingly, in particular in the case in which the same pattern is repeatedly transferred, as in the case of liquid crystal display devices and semiconductor memories, the effects described above become particularly pronounced when the repeated patterns are employed as the common patterns.

Furthermore, by using the scanning exposure method and the scanning type exposure apparatus of the present embodiment, the divided patterns 53, 54, and 55 overlap at the junction parts 58a and 58b, while scanning exposure is conducted, so that even where the picture element pattern 50 is divided, it is possible to connect this in a smooth manner, and it is possible to achieve an effect whereby the occurrence of a step difference of the connection pitch of the pattern and the attending damage to the characteristics of the device, the discontinuous changing of the connection pitch, and the decline in the quality of the device, can be prevented.

Furthermore, in the scanning exposure method and the scanning type exposure apparatus of the present embodiment, the illumination intensity of the light beam in the projection system modules 3a~3e is measured and corrected for each synchronous movement, so that even where a number of synchronous movements are carried out, it is possible to prevent fluctuations in the amount of exposure in each exposure. For this reason, it is possible to prevent fluctuations in the pattern linear width by means of the divided patterns 53, 54, and 55, and it is easily possible to maintain the quality of the device after exposure.

Furthermore, when the scanning exposure method and scanning type exposure apparatus of the present embodiment is employed, the illumination intensity is measured and corrected so that the intensity at end parts 35a~35h at which the image fields 34a~34e overlap are approximately the same, so that the illumination intensity at junction parts 36a~36d, and furthermore, at the junction parts 58a and 58b in the divided patterns 53, 54, and 55, are the same as in other regions, and it is possible to expose the entirety of the picture element pattern 50 with a uniform amount of exposure, and it is possible to make the linear width of the pattern uniform over the entirety of the pattern surface. For this reason, an effect is achieved whereby the quality of the device after exposure is greatly increased.

Furthermore, using the scanning exposure method and scanning type exposure apparatus of the present embodiment, optical paths which are not used during a scanning exposure are closed by an illumination shutter 12, so that it is possible to easily adjust the illumination regions in each scanning exposure.

Furthermore, in the scanning exposure method and the scanning type exposure apparatus of the present embodiment, among the parallel projection system modules 3a~3e, the divided patterns 53, 54, and 55 are connected by exposure light passing via the projection system modules 3b~3d which are positioned to the inside, so that in comparison with the case in which the projection system modules employed are those positioned to the outside, there is little effect of positional errors in the projection system modules, and it is possible to conduct highly accurate scanning exposure. Additionally, the step movement distance of the substrate stage 5 is also small, so that it is possible to realize high-speed throughput.

Additionally, using the scanning exposure method and the scanning type exposure apparatus of the present embodiment, prior to the second and later scanning exposures, the mask M is moved in a step manner in the Y direction by a very small movement distance based on the arrangement spacing of the unit pattern 52, so that even if the pitch of the image fields is not an integer multiple of the arrangement spacing of the unit pattern, it is possible to connect the picture element pattern 50 in an easy and reliable manner at the junction parts 58a and 58b, and it is thus possible to realize high-speed throughput.

Furthermore, in the embodiment described above, the number of optical paths disposed in parallel was 5, and the structure was thus provided with the illumination system modules 10a~10e and the projection system modules 3a~3e in accordance therewith; however, there is no need to restrict the number of optical paths insofar as a plurality of such paths exist, so that structures are possible in which four or six or more optical paths are employed.

In the embodiment described above, a structure was described in which a screen was formed on a glass substrate P by means of three scanning exposures; however, this is not necessarily so limited, and a structure is possible in which a screen is formed on the glass substrate P by means of four or more scanning exposures. Furthermore, the number of light sources 6 is not necessarily restricted to one; structures are possible in which such light sources are provided for each optical path, or a plurality of light sources may be provided, or the light from a plurality of light sources (or a single light source) may be combined using light guides or the like, and the light may be split among each optical path. In this case, it possible to eliminate the adverse effects resulting from variations in the amount of light from the light sources, and if a single light source is extinguished, the total amount of light merely declines, and it is possible to prevent the situation in which the device which was exposed is not usable.

Furthermore, the structure described was one in which the optical paths passing through the projection system modules 3a~3e were blocked by illumination shutters 12; however, this is not necessarily so limited, and structures are possible in which a part preventing transmission having a transmittivity of 0 is provided in filter 21, and when the optical path is to be blocked, the part preventing transmission is positioned in the optical path.

Substrates employed include not merely the glass substrate P used for liquid crystal display devices, but also semiconductor wafers for semiconductor devices, ceramic wafers for thin-film magnetic heads and the like, or originals of masks or reticles (synthetic quartz, silica wafers) employed in exposure apparatuses.

Types of scanning type exposure apparatuses 1 are not limited to those for manufacturing liquid crystal display devices such as that described above; they also include exposure apparatuses for semiconductor manufacturing, or scanning type exposure apparatuses for producing thin-film magnetic heads, photographic elements (CCD), or reticles R or the like.

Furthermore, the light sources 6 of the illumination optical system 2 include bright lines produced by a ultrahigh pressure mercury lamp (the g line (436 nm), the i line (365 nm)), a KrF excimer laser (248 nm), a ArF excimer laser (193 mm), a $F_2$ laser (157 nm), X rays, and the like. Furthermore, the high frequencies involved in YAG lasers or semiconductor lasers may be employed.

The magnification of projection system modules 3a~3e is not limited to an equimultiple, but may be either a reducing or an enlarging system.

Furthermore, as the projection system modules 3a~3e, when extreme ultraviolet radiation such as that of an excimer laser is employed, a material transparent to extreme ultraviolet radiation, such as quartz or silica, is employed as the glass material, while when a $F_2$ laser is employed, a catadioptric or refractive optical system is employed.

When a linear motor is used in the substrate stage 5 or the mask stage 4, either an air flotation type which uses an air flotation or a magnetic flotation type which employs Lorentz force or reactance force may be employed.

The stages 4 and 5 may be of the type which move along guides, or may be a guideless type which is not provided with guides.

The reaction force generated by the movement of the substrate stage 5 may be allowed to mechanically escape to a floor (ground) using a frame member.

The reaction force generated by the movement of mask stage 4 may be allowed to escape mechanically to a floor (ground) using a frame member.

The scanning type exposure apparatus 1 of the present embodiment may be manufactured by combining the illumination optical system 2, which comprises a plurality of optical elements, and the projection system modules 3a~3e into an exposure apparatus main body and optically adjusting this, as well as attaching a mask stage 4 and a substrate stage 5 comprising a number of mechanical parts, to the exposure apparatus main body and connecting wiring and piping thereto, and then conducting overall adjustment (electrical adjustment, operational confirmation and the like). The manufacture of the scanning type exposure apparatus 1 is preferably conducted in a clean room, the temperature and degree of cleanliness of which is monitored.

Devices such as liquid crystal display elements or semiconductor devices or the like are produced via a step in which the function and performance of each device is designed, a step in which the mask M is made based on the design step, a step in which the glass substrate P, wafer, or the like is produced, a step in which the pattern of mask M is exposed onto the glass substrate P or a wafer by a scanning type exposure apparatus of the embodiment described above, a step in which the device is assembled, and a testing step and the like.

What is claimed is:

1. A scanning exposure method in which a mask and a substrate are moved in a synchronous manner, and a first pattern and a second pattern provided on said mask are exposed onto said substrate, wherein said mask is smaller than said substrate, said first pattern includes a first partial pattern and a second partial pattern, said second pattern includes said second partial pattern and a third partial pattern, and said scanning exposure method comprising projecting said first pattern and said second pattern onto said substrate through a plurality of projection optical systems, so that said first pattern and said second pattern are joined to each other on said substrate while overlapping said second partial patterns in said first and second patterns, by moving said mask and said substrate a plurality of times in a synchronous manner.

2. A scanning exposure method of claim 1, wherein at least one of said first pattern and said second pattern is exposed onto said substrate without using at least one of said plurality of projection optical systems.

3. A scanning exposure method of claim 1, wherein said exposure is conducted by a plurality of optical systems arranged in parallel with a direction perpendicular to that of the synchronous movement of said mask and said substrate.

4. A scanning exposure method of claim 1, further comprising measuring the illumination intensity of exposure light for each of said plurality of optical systems, and correcting said illumination intensity for each synchronous movement based on the measured illumination intensity.

5. A scanning exposure method of claim 4, wherein said illumination intensity is corrected so that the illumination intensity of said optical path in overlapping projection regions is approximately the same.

6. A scanning exposure method of claim 3, wherein a selected one or more of the optical paths of said plurality of projection optical systems is blocked.

7. A scanning exposure method of claim 3, wherein said plurality of projection optical systems comprise outer side projection optical systems arranged at an outer side and at least an inner side projection optical system arranged at an inner side, and said first pattern and said second pattern are connected using exposure light transmitted via said inner side projection optical system.

8. A scanning exposure method of claim 1, wherein
    said second partial pattern has a plurality of regular patterns which are regularly arranged, and
    prior to exposing said second pattern, said mask is moved in a direction perpendicular to that of said synchronous movement, with respect to said substrate, based on an alignment spacing of said regular patterns.

9. A scanning type exposure apparatus comprising:

a mask stage that supports a mask;

a substrate stage that supports a substrate; and a plurality of projection optical systems that project patterns formed on said mask on said substrate;

wherein said mask stage and said substrate stage are synchronously moved with respect to an optical path, and a first pattern and a second pattern are exposed on said substrate;

said mask is smaller than said substrate, said first pattern includes a first partial pattern and a second partial pattern, and said second pattern includes said second partial pattern and a third partial pattern;

said scanning type exposure apparatus further comprises a control device which controls the movement of said mask stage and said substrate stage, so that said first pattern and said second pattern are joined to each other on said substrate while overlapping said second partial patterns in said first and second patterns, by moving said mask and said substrate a plurality of times in a synchronous manner.

10. A scanning type exposure apparatus according to claim 9, further comprising a switch mechanism which selects projection optical systems to be used for an exposure from said plurality of projection optical systems, according to regions to be joined to each other.

11. A scanning type exposure apparatus according to claim 9, wherein said control device shifts said substrate stage with respect to said mask stage in accordance with an exposure region to be exposed onto said substrate.

12. A scanning type exposure apparatus according to claim 9, wherein said control device shifts said substrate stage so that patterns of said mask are formed at a position corresponding to an exposure region to be exposed on said substrate.

13. A scanning type exposure apparatus according to claim 9, further comprising:

an alignment system which aligns said substrate and said mask; and a drive mechanism which withdraws said alignment system from an illumination region at the time of scanning exposure.

14. A scanning type exposure apparatus according to claim 13, wherein each of said plurality of projection optical systems comprises:

a shift mechanism which shifts an image formed by said projection optical systems in a direction perpendicular to said optical path based on information regarding the relative position between said mask and said substrate measured by said alignment system; and a magnification adjustment mechanism which adjusts magnification of said image.

15. An exposure method in which a mask and a substrate are moved in a synchronous manner while projecting patterns formed on said mask onto said substrate by a plurality of projection optical systems, said exposure method comprising:

a first step of exposing while synchronously moving said mask and said substrate in a predetermined direction;

a second step of relatively shifting said substrate with respect to said plurality of projection optical systems in a direction perpendicular to said predetermined direction; and a third step of exposing a next exposure region after said second step while synchronously moving said mask and said substrate in said predetermined direction so as to join said next exposure region to a region exposed in said first step, wherein, in at least one of said first step and said third step, an exposure is performed while blocking at least one of said projection optical systems.

16. An exposure method according to claim 15, wherein a number of said projection optical systems used for the exposure in said first step is different from a number of said projection optical systems used for the exposure in said third step.

17. An exposure method according to claim 15, wherein said plurality of projection optical systems comprise outer side projection optical systems arranged at an outer side and at least an inner side projection optical system arranged at an inner side, and an exposure region to be exposed in said first step and an exposure region to be exposed in said third step are exposed so as to overlap adjoining portions of said exposure regions to form an overlapped portion, and said overlapped portion is exposed using said inner side projection optical system.

18. An exposure method according to claim 15, wherein said second step and said third step are repeated in accordance with a size of said substrate.

19. An exposure method according to claim 15, wherein, in said second step, said substrate is relatively shifted with respect to said mask in a direction perpendicular to said predetermined direction.

20. An exposure method in which a mask and a substrate are moved in a synchronous manner while projecting patterns formed on said mask onto said substrate by a plurality of projection optical systems, said exposure method comprising:

a first step of exposing while synchronously moving said mask and said substrate in a predetermined direction;

a second step of relatively shifting said substrate with respect to said plurality of projection optical systems in a direction perpendicular to said predetermined direction; and a third step of exposing a next exposure region after said second step while synchronously moving said mask and said substrate in said predetermined direction so as to join said next exposure region to a region exposed in said first step, wherein a length in said direction perpendicular to said predetermined direction of said exposure region to be exposed in said first step is different from a length of said next exposure region to be exposed in said third step.

21. An exposure method according to claim 20, wherein said lengths in said direction perpendicular to said predetermined direction of said exposure regions to be exposed in said first and third steps are adjusted by blocking a part of an optical path of illumination light illuminating said mask.

22. An exposure method according to claim 20, wherein said lengths in said direction perpendicular to said predetermined direction of said exposure regions to be exposed in said first and third steps are adjusted in accordance with a size of said substrate.

* * * * *